United States Patent
Li

(10) Patent No.: US 7,002,224 B2
(45) Date of Patent: Feb. 21, 2006

(54) TRANSISTOR WITH DOPED GATE DIELECTRIC

(75) Inventor: Hong-Jyh Li, Austin, TX (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/771,075

(22) Filed: Feb. 3, 2004

(65) Prior Publication Data
US 2005/0167764 A1 Aug. 4, 2005

(51) Int. Cl.
H01L 29/78 (2006.01)
(52) U.S. Cl. .................. 257/405; 257/406; 257/410; 257/411; 257/412
(58) Field of Classification Search ............... 257/405, 257/406, 410, 411, 412
See application file for complete search history.

(56) References Cited

U.S. PATENT DOCUMENTS

| | | |
|---|---|---|
| 5,108,935 A | 4/1992 | Rodder |
| 5,576,226 A | 11/1996 | Hwang |
| 5,596,218 A | 1/1997 | Soleimani et al. |
| 5,714,788 A | 2/1998 | Ngaoaram |
| 5,872,387 A | 2/1999 | Lyding et al. |
| 6,051,865 A | 4/2000 | Gardner et al. |
| 6,100,558 A | 8/2000 | Krivokapic et al. |
| 6,110,784 A | 8/2000 | Gardner et al. |
| 6,261,889 B1 | 7/2001 | Ono |
| 6,476,454 B1 | 11/2002 | Suguro |
| 6,498,374 B1 * | 12/2002 | Ohuchi ...................... 257/368 |
| 6,821,868 B1 * | 11/2004 | Cheng et al. ............... 438/517 |

OTHER PUBLICATIONS

Inumiya, S., et al., "Fabrication of HfSiON Gate Dielectrics by Plasma Oxidation and Nitridation, Optimized for 65nm node Low Power CMOS Applications," 2003 Symposium on VLSI Technology Digest of Technical Papers, pp. 18-19, Document No. 4-89114-035-6/03.

Wolf, S., "Silicon Processing for the VLSI Era: Diffusion in Silicon" pp. 336-339.

"Front End Processes," International Technology Roadmap for Semiconductor (ITRS), 2003 Edition, pp. 23-25, http://member.itrs.net/.

* cited by examiner

Primary Examiner—Gene M. Munson
(74) Attorney, Agent, or Firm—Slater & Matsil, L.L.P.

(57) ABSTRACT

A transistor and method of manufacture thereof. A semiconductor workpiece is doped before depositing a gate dielectric material. Using a separate anneal process or during subsequent anneal processes used to manufacture the transistor, dopant species from the doped region of the workpiece are outdiffused into the gate dielectric, creating a doped gate dielectric. The dopant species fill vacancies in the atomic structure of the gate dielectric, resulting in a transistor having increased speed, reduced power consumption, and improved voltage stability.

25 Claims, 2 Drawing Sheets

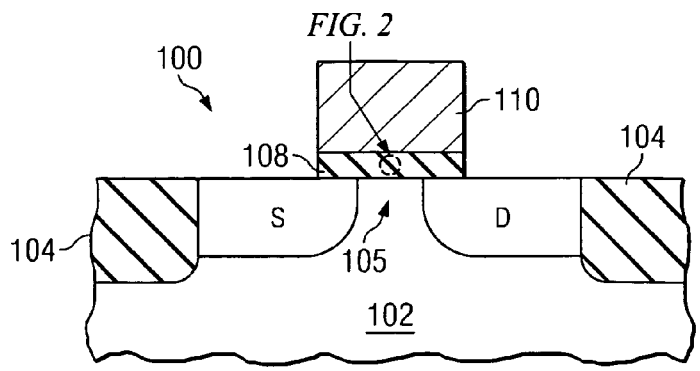
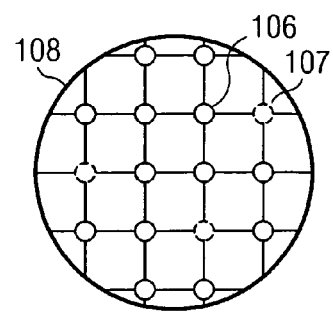
FIG. 1
*(PRIOR ART)*
FIG. 2
*(PRIOR ART)*
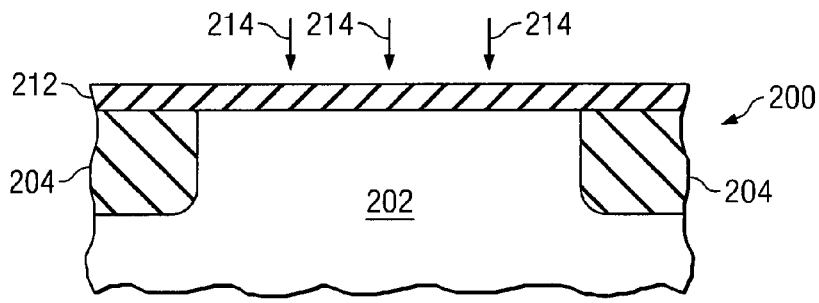
FIG. 3
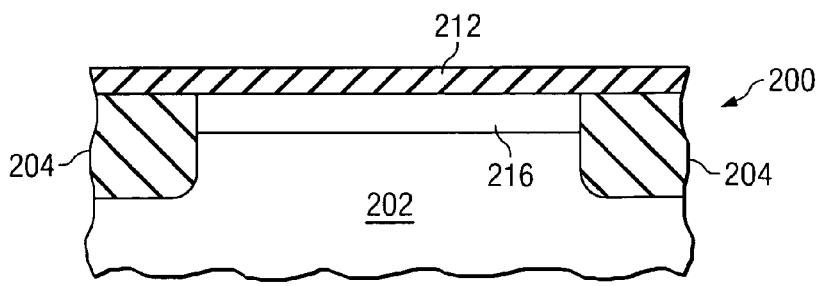
FIG. 4
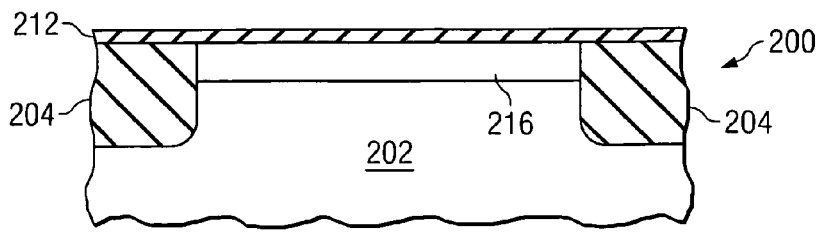
FIG. 5

TRANSISTOR WITH DOPED GATE DIELECTRIC

TECHNICAL FIELD

The present invention relates generally to semiconductor devices, and more particularly to a method of fabricating a transistor and a structure thereof.

BACKGROUND

Semiconductor devices are used in a variety of electronic applications, such as personal computers, cell phones, digital cameras, and other electronic equipment, as examples. A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

The gate dielectric for MOSFET devices has in the past typically comprised silicon dioxide. However, as devices are scaled down in size, silicon dioxide becomes a problem because of gate leakage current, which can degrade device performance. Therefore, there is a trend in the industry towards the development of the use of high dielectric constant (k) materials (e.g., having a dielectric constant of 3.9 or greater, for example) for use as the gate dielectric in MOSFET devices.

High k gate dielectric development has been identified as one of the grand challenges in the 2003 edition of International Technology Roadmap for Semiconductor (ITRS), incorporated herein by reference, which identifies the technological challenges and needs facing the semiconductor industry over the next 15 years. For low power logic (for portable electronic applications, for example), the main issue is low leakage current, which is necessary in order to extend battery life. Device performance is then maximized according to the low leakage current requirements. Gate leakage current must be controlled in low power applications, as well as sub-threshold leakage, junction leakage, and band-to-band tunneling.

To fully realize the benefits of transistor scaling, the gate oxide thickness needs to be scaled down to less than 2 nm. However, the resulting gate leakage currents make the use of such thin oxides impractical in many device applications where low standby power consumption is required. For this reason, gate oxide dielectric material will eventually be replaced by an alternative dielectric material that has a higher dielectric constant. However, the device performance of using high k dielectric materials suffers from trapped charge in the dielectric layer which deteriorates the mobility, making the drive current lower than in transistors having silicon dioxide gate oxides, and hence reducing the speed and performance of transistors having high k gate dielectric materials.

One proposed method of manufacturing a transistor is to introduce dopants into a top surface of a gate dielectric after depositing a gate dielectric material. See Inumiya, S., et al., "Fabrication of HfSiON Gate Dielectrics by Plasma Oxidation and Nitridation, Optimized for 65 nm node Low Power CMOS Applications," 2003 Symposium on VLSI Technology Digest of Technical Papers, pp. 18–19, Document No. 4-89114-035-6/03, which is incorporated herein by reference. In this method, nitrogen is introduced on top of a high k gate dielectric using plasma in order to directly nitridize the gate dielectric material. While this method provides increased hole mobility, it requires plasma processes which can be difficult to work with and may cause damage to the devices manufactured, as well as requiring an additional tool for the plasma processing.

Therefore, what is needed in the art is a transistor design and fabrication method having a high k gate dielectric material with increased speed and improved performance, that is compatible with semiconductor device manufacturing processes.

SUMMARY OF THE INVENTION

These and other problems are generally solved or circumvented, and technical advantages are generally achieved, by preferred embodiments of the present invention which comprise a transistor having a doped gate dielectric, which reduces the leakage current pathways, creating a faster transistor. A semiconductor workpiece is doped before depositing a gate dielectric material. Using a separate anneal process or during subsequent anneal processes used to manufacture the transistor, dopant species from the doped region of the workpiece are diffused into the gate dielectric, creating a doped gate dielectric. The dopant species fill vacancies in the atomic structure of the gate dielectric, resulting in a transistor having increased speed, reduced power consumption, and improved voltage stability.

In accordance with a preferred embodiment of the present invention, a transistor includes a workpiece, a doped region disposed in the workpiece, the doped region including a dopant species, and a doped gate dielectric disposed over the doped region of the workpiece, the doped gate dielectric including the dopant species. A gate is disposed over the gate dielectric, and a source region and a drain region are formed in at least the doped region of the workpiece, wherein the source region, drain region, gate, and doped gate dielectric comprise a transistor.

In accordance with another preferred embodiment of the present invention, a method of fabricating a transistor includes providing a workpiece, introducing a dopant species into the workpiece to form a doped region in the workpiece, and depositing a gate dielectric material over the doped region of the workpiece. A gate material is deposited over the gate dielectric material, the gate material and gate dielectric material are patterned to form a gate and a gate dielectric over the doped region of the workpiece, and the dopant species are transferred from the workpiece to the gate dielectric material to form a doped gate dielectric material. A source region and a drain region are formed in at least the doped region of the workpiece, wherein the source region, drain region, gate, and doped gate dielectric comprise a transistor.

Advantages of the preferred embodiments of the present invention include providing a transistor design and manufacturing method thereof wherein the electrical performance of the transistor is improved. The transistor has increased speed, improved voltage stability, and increased electron and hole mobility. The dopant species fill vacancies in the gate dielectric, removing defects in the gate dielectric material, eliminating leakage paths and improving the transistor's performance. The gate dielectric is doped using processes that are compatible with semiconductor device manufacturing process flows, and that are easily implemented into existing manufacturing process flows.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a cross-sectional view of a prior art transistor;

FIG. 2 shows a more detailed view of the gate dielectric material of the transistor shown in FIG. 1;

FIGS. 3 through 7 show cross-sectional views of a transistor at various stages of manufacturing in accordance with a preferred embodiment of the present invention, wherein the workpiece is doped with a dopant species before depositing a gate dielectric material;

FIG. 8 shows a more detailed view of the doped gate dielectric material shown in FIG. 7.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 6:
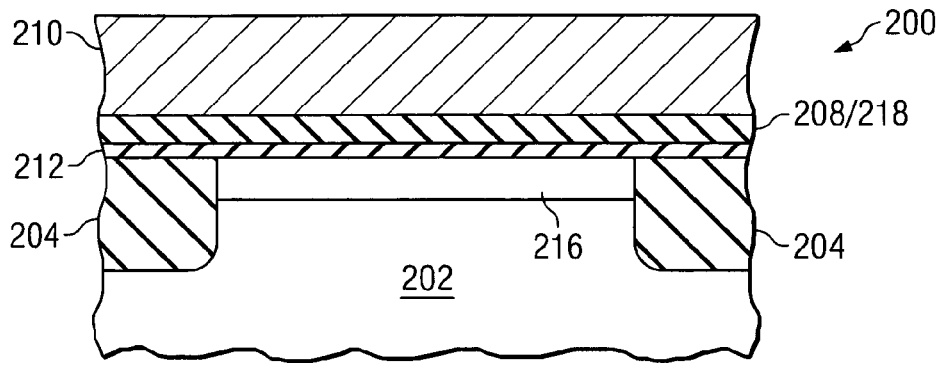

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor formed on a semiconductor device. The invention may also be applied, however, to MOSFETs or other transistor devices, and may include PMOS, NMOS, or CMOS devices, as examples. Only one transistor is shown in each of the figures; however, there may be many transistors formed on the semiconductor devices shown.

FIG. 1 shows a cross-sectional view of a prior art transistor 100 formed over a workpiece 102. After shallow trench isolation (STI) regions 104 are formed within the workpiece 102, a gate dielectric material 108 is deposited over the workpiece 102 and STI regions 104. A gate material 110 is deposited over the gate dielectric material 108. The gate material 110 and gate dielectric material 108 are patterned using traditional lithography techniques to form a gate 110 and gate dielectric 108, as shown. A source region S and a drain region D are typically formed after the gate 110 and gate dielectric 108 are patterned. A channel region 105 resides beneath the gate 110 and gate dielectric 108, as shown.

FIG. 2 shows a more detailed view of the gate dielectric 108 shown in FIG. 1. When the gate dielectric 108 comprises a high k dielectric material, as is the trend in the semiconductor industry, vacancies 107 may form during the deposition of the gate dielectric material 108. Hafnium dioxide ($HfO_2$) in particular has a tendency to form many vacancies, for example, in effect having a chemical formula of about $HfO_{1.95}$, for example. The oxygen vacancies 107 are dispersed throughout the atomic structure of the gate dielectric 108, between the atoms 106 of the gate dielectric material 108. The vacancies 107 create charge-trapping locations, which are defects in the gate dielectric 108 that provide a path for leakage current from the gate 110 to the channel region 105 of the transistor 100. Leakage current slows down the transistor 100 response, decreasing mobility, and causing device failures.

Therefore, what is needed in the art is a method and structure that reduces or eliminates vacancies 107 formed in gate dielectric materials 108 in the manufacturing process of transistors 100.

Embodiments of the present invention achieve technical advantages by reducing or eliminating these vacancies 107 by introducing dopant species into the workpiece which later out-diffuses into the gate dielectric material. FIGS. 3 through 7 show cross-sectional views of a preferred embodiment of the present invention at various stages of manufacturing. Referring first to FIG. 3, a semiconductor device 200 comprises a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate, for example.

Isolation regions 204 may be formed in various locations on the workpiece 202, as shown. The isolation regions 204 may comprise STI regions that are disposed on either side of a channel region 205 (see FIG. 7) of a transistor device 200, for example. The isolation regions 204 may be formed by depositing a photoresist over the workpiece 202, not shown. The photoresist may be patterned using lithography techniques, and the photoresist may be used as a mask while the workpiece 202 is etched to form holes or patterns for the isolation regions 204 in a top surface of the workpiece 202. An insulator such as an oxide, for example, may be deposited over the workpiece 202 to fill the patterns, forming isolation regions 204. Alternatively, the isolation regions 204 may be formed by other methods, for example. In accordance with embodiments of the present invention, the isolation regions 204 may be formed either before or after the workpiece 202 top surface is doped, for example.

In accordance with a preferred embodiment of the present invention, a dopant species 214 is introduced into the top surface of the workpiece 202 to form a doped region 216, as shown in FIG. 4. The dopant species 214 comprises at least one Group V, VI or VII element of the chemical periodic table, in a preferred embodiment. In another embodiment, the dopant species 214 preferably comprises nitrogen and/or fluorine. The dopant species 214 are preferably introduced into the workpiece 202 by ion implantation. Introducing the dopant species 214 preferably comprises implanting the ions of the dopant species 214 at an energy level of about 5 KeV or less, at an implantation dose in the order of about $1\times10^{14}$ to $1\times10^{15}$ ions/cm$^2$, as examples. The depth of the implantation of the dopant species 214 depends on the energy level of the implantation step. Preferably, the implantation depth of the dopant species 214 into the workpiece 202 top surface is the smallest depth possible, so that the dopant species 214 will easily outdiffuse into the subsequently deposited gate dielectric, to be described further herein.

Figures 7, 8:
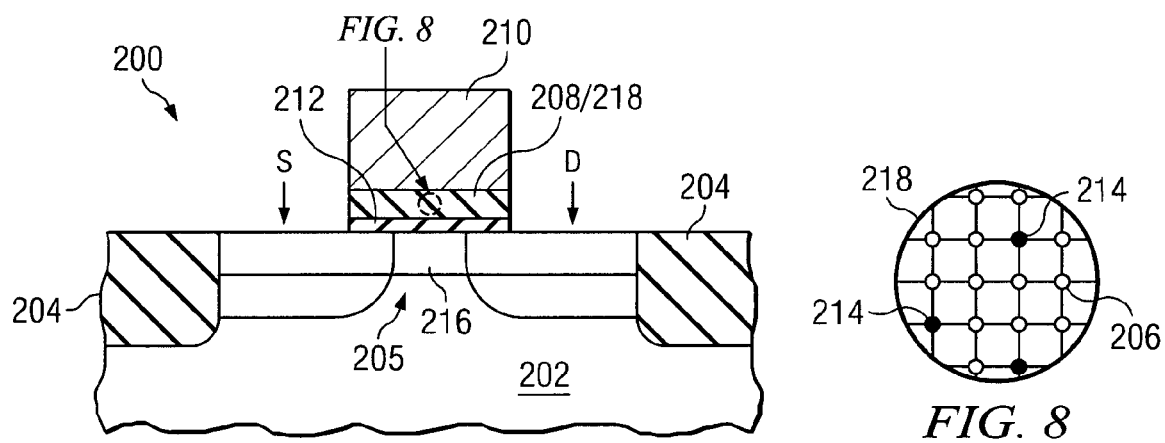

The dopant species 214 may be driven in using an additional anneal step after the deposition of the gate dielectric material, as shown in FIG. 6, or by subsequent anneal steps that are used to fabricate the transistor 200 or other devices or elements on the workpiece 200, such as an implantation step to drive in dopants to form a source and drain (to be described further herein; see FIG. 7). The doped region 216 of the workpiece 202 preferably comprises a thickness of about 100 Å or less, for example. The doped region 216 may alternatively comprise other thicknesses. Note that a top portion of the isolation regions 204 may also be doped with the dopant species 214 during the introduction of the dopant species 214 into the workpiece 202, not shown.

Referring again to FIG. 3, before introducing the dopant species 214 to the workpiece 202 top surface, a thin insulating layer 212 may be formed over the top surface of the workpiece 202 and the isolation regions 204, as shown. The thin insulating layer 212 is optional and is not required for embodiments of the present invention. The optional thin insulating layer 212 preferably comprises an oxide such as silicon dioxide or silicon oxynitride, as examples. The thin insulating layer may alternatively comprise other insulators, such as nitrides, for example. The optional thin insulating layer 212 is preferably deposited in a thickness of about 100 Å or less, as an example.

The optional thin insulating layer 212 is advantageous because it provides protection for the top surface of the workpiece 202 during the implantation of the dopant species 214. For example, physical damage such as pitting or chipping may be caused to the top surface of the workpiece 202 when the dopant species 214 are introduced. Such physical damage in the channel region 205 (se FIG. 7) can degrade the performance of the transistor 200. For example, at implantation energy levels of 5 KeV or greater, preferably the thin insulating layer 212 is used, so that the sacrificial thin insulating layer 212 top surface is damaged rather than the top surface of the workpiece 202 in the channel region 205. Therefore, the optional thin insulating layer 212 functions as a sacrificial insulating layer, which may later be partially or completely removed, to be described further herein.

Figure 9:
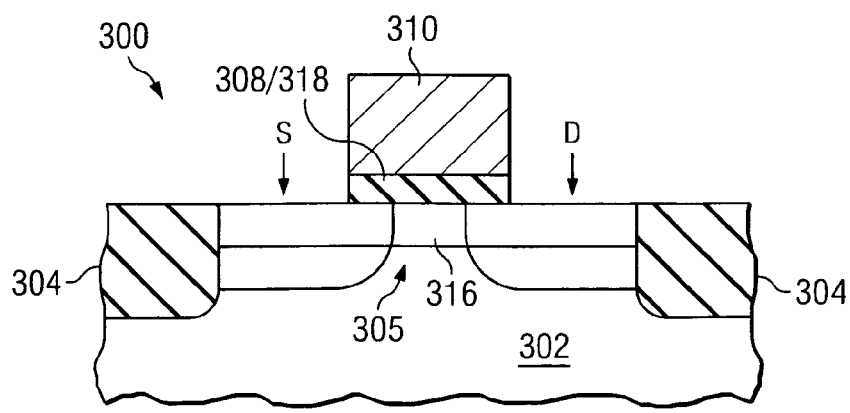
FIG. 9 shows a cross-sectional view of a transistor fabricated in accordance with another preferred embodiment of the present invention.

Therefore, in one embodiment of the present invention, the dopant species 214 pass through the optional thin insulating layer 212 to form a doped region 216 at a top surface of the workpiece 202, as shown in FIG. 4. Preferably, at least a portion of the optional thin insulating layer 212 is stripped or removed after the implantation of the dopant species 214 into the workpiece 202 top surface, as shown in FIG. 5. Preferably, in one embodiment, the remaining optional thin insulating layer 212 residing over the workpiece 202 and isolation regions 204 comprises a thickness of about one nanolayer of oxide, or about 10 Å or less. In another preferred embodiment, all of the optional thin insulating layer 212 may be removed, or the thin insulating layer 212 may not be used at all, as shown in FIG. 9. The thin insulating layer 212 may be stripped using a hydrofluoric acid (HF) dip or other chemistries and removal processes, as examples.

After all or part of the optional thin insulating layer 212 is stripped (if used), the workpiece 202 is cleaned, often referred to in the art as a "pre-gate treatment". As examples, the pre-gate treatment may comprise an HF dip followed by an ammonia anneal, an HF dip followed by ozone cleaning, or an HF dip followed by an ozone cleaning and a subsequent ammonia anneal. Alternatively, the workpiece 202 may be exposed to other types of pre-gate treatments, for example.

A gate dielectric material 208 is deposited over the thin insulating layer 212, as shown in FIG. 6, or over the top surface of the doped region 216 of the workpiece 202 and isolation region 204, if the thin insulating layer 212 is not used. The gate dielectric material 208 preferably comprises a thickness of about 50 Å or less, and preferably comprises an insulating material such as a high k dielectric material. The gate dielectric material may alternatively comprise other insulating materials, such as an oxide, for example. In one embodiment, the gate dielectric material 208 preferably comprises $Si_3N_4$, $Al_2O_3$, $Ta_2O_5$, $HfO_2$, $TiO_2$, $HfSiO_x$, $ZrO_2$, or $ZrSiO_x$, as examples. The gate dielectric material 208 may be deposited by atomic layer deposition (ALD), chemical vapor deposition (CVD), or metal oxide CVD (MOCVD), as examples, although alternatively, other deposition methods may be used.

The workpiece 202 may then optionally be subjected to a post-deposition anneal, particularly if the gate dielectric material 208 comprises a high k dielectric material, for example. The post-deposition anneal may comprise an anneal at about 700° C. The post-deposition anneal may or may not be at a high enough temperature to cause the diffusion of the dopant species 214 into the gate dielectric material 208. The post-deposition anneal may be adapted to reduce the number of thermal cycles required to manufacture the transistor 200, for example.

Next, a gate material 210 is deposited over the unpatterned gate dielectric material 208, as shown in FIG. 6. The gate material 210 preferably comprises a conductor such as a semiconductor material or a metal, in one embodiment. For example, the gate material 210 may comprise TiN, HfN, TaN, a fully silicided gate material (FUSI), or other metals, as examples. Alternatively, in another embodiment, the gate material 210 may comprise polysilicon or other semiconductor materials.

The gate material 210 and the gate dielectric material 208 are patterned to form a gate 210 and gate dielectric 208, as shown in FIG. 7. The gate material 210 and gate dielectric material 208 may be patterned using traditional lithography techniques, by depositing a photoresist, patterning the photoresist, and using the photoresist as a mask to pattern the gate material 210 and gate dielectric material 208, not shown, for example. Alternatively, the gate material 210 and gate dielectric material 208 may be directly etched or may be patterned using other methods, for example.

A source region S and drain region D are then formed proximate the channel region 205. More particularly, the source region S and the drain region D are preferably formed in at least the doped region 216 of the workpiece 202, as shown. Note that in this embodiment, portions of the source region S and drain region D are also formed in a top portion of the workpiece 202 that is undoped. The source region S and drain region D may be formed using an extension implant, which may comprise implanting dopants using a low energy implant at about 200 eV to 1 KeV, for example.

The workpiece may then be annealed to drive in the source S and drain D dopants. For example, the workpiece 202 may be heated to about 1000° C. for about 10 seconds, to activate the source and drain implant.

In one embodiment, the anneal process to form the source region S and the drain region D also causes the outdiffusion of the dopant species in the doped region 216 of the workpiece 202 through the optional thin insulating layer 212 and into the gate dielectric 208 to form a doped gate dielectric 218. This embodiment of the present invention is advantageous because an additional anneal step is not required, saving manufacturing cost and time. However, in other embodiments, alternatively, the workpiece 202 may be annealed at any time after the gate dielectric material 208 is deposited. For example, the workpiece 202 may be annealed immediately after the gate dielectric material 208 is deposited, after the gate material 210 is deposited, or after the gate material 210 and/or gate dielectric material 208 are patterned. In FIGS. 6 and 7, the gate dielectric is indicated by reference number 208/218, wherein 208 is representative of the gate dielectric in an undoped state, e.g., before annealing, and wherein 218 is representative of the gate dielectric in a doped state, e.g., after an anneal process.

The anneal process to cause a portion of the dopant species 214 to transfer or outdiffuse from the doped region 216 of the workpiece 202 to the gate dielectric 208, forming doped gate dielectric 218, preferably comprises a temperature of about 900 to 1050° C., as examples. The anneal process to transfer the dopant species from the doped region 216 to the gate dielectric 208 may comprise a rapid thermal anneal (RTA) or a spike anneal, as examples.

A more detailed view of the doped gate dielectric 218 of FIG. 7 is shown in FIG. 8. Atoms of the dopant species 214 fill vacancies between atoms 206 of the atomic structure of the gate dielectric material 208 (of FIGS. 6 and 7, for example), as shown. This is advantageous because defects in the gate dielectric material 208 are eliminated. For example, the dopant species 214 atoms eliminate paths for leakage current from the gate 210 into the channel region 205 of the transistor 200.

A spacer material such as silicon nitride or other insulator, as examples, may then be deposited over the entire workpiece 202, and the spacer material may be etched using an etch process such as an anisotropic etch, leaving spacers adjacent sidewalls of the gate 210, doped gate dielectric 218, and optional thin insulating layer 212 (not shown). Alternatively, the spacers may be patterned using a photoresist as a mask, as an example, not shown. To complete the extension implant of the source region S and drain region D, a second dopant implantation process may then be performed, preferably using a high energy implantation process. For example, the second implantation process may be at about 5 KeV to 20 KeV. A high temperature anneal may then be performed to drive in and activate the dopant of the source and drain regions S and D. Again, the gate dielectric 208 may be doped by diffusion of the dopant species 214 from the doped region 216 during such subsequent anneals to form the doped gate dielectric 218, rather than requiring an additional anneal step in the manufacturing process flow sequence.

Doping the top surface of the workpiece 202 and transferring the dopant species to the gate dielectric 208 to form a doped gate dielectric 218 in accordance with embodiments of the present invention as described herein are also advantageous and have application in "gate last" procedures used to manufacture transistors. In a "gate last" procedure, a dummy gate material (not shown) is deposited over the workpiece 202 or thin insulating layer 212 (see FIG. 7), and the dummy gate material is patterned in the shape of a gate that will later be formed from a gate material. The dummy gate material may comprise about 1000 Å or less of an oxide or a nitride, for example. The same lithography mask may be used to pattern the dummy gate material and the actual gate material 210, for example. Source and drain implant and anneal procedures are then performed to form source S and drain D regions in the workpiece 202, wherein the dummy gate material protects the workpiece 202 beneath the dummy gate material during the implantation step. Then the dummy gate material is stripped or removed. A gate dielectric material 218 is then deposited over the workpiece 202, and a gate material 210 is deposited over the gate dielectric 208. The gate material 210 and gate dielectric material 208 are patterned to form a gate 210 and a gate dielectric 208. In this embodiment, the doped region 216 may be formed in the top surface of the workpiece 202 either after or before the source S and drain D regions are formed. For example, the doped region may be formed in the top surface of the workpiece 202 after the dummy gate material is removed. Again, as previously described herein, the dopant species 214 of the doped region 216 may be transferred to the gate dielectric 208 to form a doped gate dielectric 218 using a separate, additional anneal step, or during other anneal processes used to fabricate the transistor 200.

FIG. 9 shows a cross-sectional view of an embodiment of the present invention, wherein a thin insulating layer (such as layer 212 in FIG. 4) is not used, or wherein the thin insulating layer 212 is completely removed before depositing a gate dielectric material 308/318. Similar reference numbers are designated for the various elements as were used in FIGS. 3 through 7. To avoid repetition, each reference number shown in the diagram is not described in detail herein. Rather, similar materials x02, x04, x05, etc. . . . are preferably used for the material layers shown as were described for FIGS. 3 through 7, where x=2 in FIGS. 3 through 7 and x=3 in FIG. 9. As an example, the preferred and alternative materials listed for gate dielectric material 208 in the description for FIGS. 3 through 7 are preferably also used for gate dielectric material 308 in FIG. 9.

Advantages of the preferred embodiments of the present invention include providing a transistor 200, 300 design and manufacturing method thereof, wherein the electrical performance of the transistor 200, 300 is improved. The transistor 200, 300 has increased speed, improved voltage stability, and increased electron and hole mobility. The dopant species 214 such as N, F or both N and F, fill vacancies in the gate dielectric 218/318, removing defects in the gate dielectric material 208/308, eliminating charge-trapping and leakage paths, and improving the transistor 200, 300 performance. The gate dielectric 208/308 is doped using processes that are compatible with semiconductor device manufacturing process flows, and that are easily implemented into existing manufacturing process flows. For example, in one embodiment, an additional anneal step is not required, and the dopant species 214 is outdiffused from the workpiece 202 into the gate dielectric 218 during anneal processes for other devices or elements of the workpiece 202. Additional tools are not required by embodiments of the present invention. Embodiments of the present invention may be used in "gate first" or "gate last" manufacturing processes, and may be used in the manufacture of transistors having both high-k dielectrics and/or oxide dielectrics.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
   a workpiece;
   a doped region disposed in the workpiece, the doped region including a dopant species;
   a doped gate dielectric disposed over the doped region of the workpiece, the doped gate dielectric including the dopant species, wherein the doped gate dielectric comprises about 50 Å or less of $Si_3N_4$, $Al_2O_3$, $Ta_2O_5$, $HfO_2$, $TiO_2$ $HfSiO_x$, $ZrO_2$, or $ZrSiO_x$;
   a gate disposed over the gate dielectric; and
   a source region and a drain region formed in at least the doped region of the workpiece, wherein the source region, drain region, gate, and doped gate dielectric comprise a transistor.

2. The transistor according to claim 1, wherein the dopant species comprises at least one Group V, VI or VII element.

3. The transistor according to claim 2, wherein the dopant species comprises fluorine.

4. The transistor according to claim 2, wherein the dopant species comprises nitrogen.

5. The transistor according to claim 1, wherein the doped region comprises a thickness of about 100 Å or less.

6. The transistor according to claim 1, wherein the dopant species fills vacancies in the atomic structure of the gate dielectric.

7. The transistor according to claim 1, wherein the doped gate dielectric comprises a high k dielectric material.

8. The transistor according to claim 1, further comprising a thin insulating layer disposed between the gate dielectric and the doped region of the workpiece.

9. The transistor according to claim 8, wherein the thin insulating layer comprises a thickness of about 10 Å or less.

10. The transistor according to claim 9, wherein the thin insulating layer comprises silicon dioxide or silicon oxynitride.

11. The transistor according to claim 1, wherein the workpiece comprises a silicon-on-insulator (SOI) wafer.

12. The transistor according to claim 1, wherein the doped gate dielectric comprises an oxide.

13. The transistor according to claim 1, wherein the gate comprises a semiconductor material.

14. The transistor according to claim 1, wherein the gate comprises a metal.

15. A transistor, comprising:
    a workpiece;
    a doped region disposed in the workpiece, the doped region including a dopant species, wherein the dopant species comprises fluorine;
    a doped gate dielectric disposed over the doped region of the workpiece, the doped gate dielectric including the dopant species;
    a metal gate disposed over the gate dielectric; and
    a source region and a drain region formed in at least the doped region of the workpiece, wherein the source region, drain region, gate, and doped gate dielectric comprise a transistor.

16. The transistor according to claim 15, wherein the doped gate dielectric comprises a high k dielectric material.

17. The transistor according to claim 15, further comprising a thin insulating layer disposed between the gate dielectric and the doped region of the workpiece, wherein the thin insulating layer comprises a thickness of about 10 Å or less.

18. The transistor according to claim 17, wherein the thin insulating layer comprises silicon dioxide.

19. The transistor according to claim 17, wherein the thin insulating layer comprises silicon oxynitride.

20. The transistor according to claim 15, wherein the workpiece comprises a silicon-on-insulator (SOI) wafer.

21. The transistor according to claim 15, wherein the doped gate dielectric comprises an oxide.

22. A transistor, comprising:
    a workpiece;
    a doped region disposed in the workpiece, the doped region including a dopant species;
    a doped gate dielectric disposed over the doped region of the workpiece, the doped gate dielectric including the dopant species, wherein the doped gate dielectric comprises about 50 Å or less of $Si_3N_4$, $Al_2O_3$, $Ta_2O_5$, $HfO_2$, $TiO_2$ $HfSiO_x$, $ZrO_2$, or $ZrSiO_x$;
    a metal gate disposed over the gate dielectric; and
    a source region and a drain region formed in at least the doped region of the workpiece, wherein the source region, drain region, gate, and doped gate dielectric comprise a transistor.

23. The transistor according to claim 22, wherein the dopant species comprises at least one Group V, VI or VII element.

24. The transistor according to claim 23, wherein the dopant species comprises nitrogen.

25. The transistor according to claim 22, wherein the dopant species comprises fluorine.

* * * * *